(12) United States Patent
Haruta (10) Patent No.: US 6,458,509 B1
(45) Date of Patent: Oct. 1, 2002

(54) RESIST COMPOSITIONS

(75) Inventor: Yoichi Haruta, Aichi (JP)

(73) Assignee: Toagosei Co., Ltd., Tokyo (JP)

( * ) Notice: Subject to any disclaimer, the term of this patent is extended or adjusted under 35 U.S.C. 154(b) by 0 days.

(21) Appl. No.: 09/561,954

(22) Filed: May 1, 2000

(30) Foreign Application Priority Data

| Apr. 30, 1999 | (JP) | 11-123745 |
| Jun. 2, 1999 | (JP) | 11-154984 |
| Oct. 26, 1999 | (JP) | 11-303546 |

(51) Int. Cl.$^7$ ............................................. G03F 7/038
(52) U.S. Cl. ................... 430/280.1; 430/277.1; 430/285.1; 430/281.1; 430/954; 430/18
(58) Field of Search ................ 430/277.1, 280.1, 430/285.1, 281.1, 954, 18

(56) References Cited

U.S. PATENT DOCUMENTS

| 4,741,987 A | | 5/1988 | Tohda et al. ............. 430/288.1 |
| 5,837,155 A | * | 11/1998 | Inagaki et al. ............... 216/18 |
| 5,849,857 A | * | 12/1998 | Awaji et al. .............. 430/285.1 |
| 5,948,514 A | * | 9/1999 | Komori et al. ........... 430/280.1 |
| 6,048,666 A | * | 4/2000 | Niwa et al. ............... 430/280.1 |

FOREIGN PATENT DOCUMENTS

JP  10-182758  *  7/1998

OTHER PUBLICATIONS

Toa Gosei Chem Ind Ltd, Derwent–Acc–No. 1998–433924, File DWPI on West Database, English Abstract of Japan 10–182758, Derwent Information Ltd, 2 pages, Jul. 7, 1998.*
Haruda et al, CA 129: 82422, English Abstract of Japan 10–182758, Chemical Abstracts Online, STN Database, ACS, 3 pages, Jul. 7, 1998.*
Haruta et al, Pub–No. JP410182758A, English Abstract of Japan 10–182758, JPAB, (Japanese Abstracts) File on West Database (Inhouse USP TO), JPO, 1 page, Jul. 7, 1998.*

* cited by examiner

Primary Examiner—Cynthia Hamilton
(74) Attorney, Agent, or Firm—Sughrue Mion, PLLC (57) ABSTRACT

A resist composition comprising: a curable composition mainly comprising (1) at least one of an alkali-soluble acrylic compound and an alkali-soluble methacrylic compound; (2) a fine-particulate crosslinked elastic polymer having a carboxyl group; and (3) an agent for enhancing adhesion with respect to copper.

9 Claims, 1 Drawing Sheet

RESIST COMPOSITIONS

FIELD OF THE INVENTION

The present invention relates to a resist composition suitable for the production of printed circuit boards. More particularly, the present invention relates to a resist composition having excellent reliability in heat resistance, adhesion to copper, electrical characteristics, fire retardance and impact resistance. The resist composition is particularly useful as a photosolder resist.

BACKGROUND OF THE INVENTION

With the recent reduction in the size of electronic apparatus and increase in the number of functions thereof, the trend of printed circuit boards is toward higher density. For example, it has been considered to produce a multi-chip module having a plurality of bare chips or chip size packages mounted on a resin substrate base, which is excellent in mass producibility, instead of on the conventional base, i.e., a device base or a ceramic base. In order to produce such a high density mounting board, a resist, particularly a photosolder resist, excellent in resolution, heat resistance, reliability, workability, etc. is required.

As a photosolder resist there is disclosed in JP-A-61-243869 (The term "JP-A" as used herein means an "unexamined published Japanese patent application") a photosetting and thermosetting liquid resist ink composition, which can be developed with an alkaline solution. The composition comprises: (A) an active energy ray-curing resin obtained by the reaction of: a reaction product of a novolak epoxy compound and an unsaturated monocarboxylic acid; and a saturated or unsaturated polybasic acid anhydride; (B) a photopolymerization initiator; (C) a diluent; and (D) a thermosetting component comprising an epoxy compound having two or more epoxy groups per molecule.

The cured product of such a composition is excellent in hardness as a solder resist but exhibits a deteriorated flexibility. Therefore, when such a composition is applied, in the form of liquid resist to form a solder resist, onto a printed circuit board which is thin for accomplishing high density wiring, the resulting cured solder resist may crack due to warpage, twist or impact developed upon mounting. When cracking occurs, it causes several troubles. For example, solder may be attached to undesirable areas during soldering. Further, moisture absorption due to the cracking may cause corrosion of a conductor or a decrease of the insulating property between conductors.

The active energy ray-curing resin having carboxylic acid and the epoxy resin constituting the liquid resist readily react with each other and thus they are usually used in the form of a two-liquid type resist. In other words, when a liquid resist is formed on a printed circuit board, for example, by screen-printing, two components need to be mixed immediately before use. It is also disadvantageous in that available pot life is limited, resulting in a deteriorated workability. Various one-liquid type photosolder resists developable with an alkaline solution have also been studied. However, no photosolder resists excellent both in crack resistance and adhesion to copper have been obtained.

SUMMARY OF THE INVENTION

The inventors made studies of a composition capable of preventing the above-mentioned cracking of a photosolder resist and a method for imparting a good adhesion between the resin layer and copper.

Accordingly, an object of the present invention is to provide a resist composition, which can be developed with an alkaline aqueous solution, which has satisfactory impact resistance and heat resistance as well as satisfactory reliability in electrical insulating properties, etc., and which further provides excellent workability.

Another object of the present invention is to provide a solder resist formed from the resist composition and a printed circuit board having the solder resist.

Other objects and effects of the present invention will become apparent from the following description.

The above-described objects of the present invention have been achieved by providing:

1. A resist composition comprising:
    a curable composition mainly comprising (1) at least one of an alkali-soluble acrylic compound and an alkali-soluble methacrylic compound;
    (2) a fine-particulate crosslinked elastic polymer having a carboxyl group; and
    (3) an agent for enhancing adhesion with respect to copper.

The terms "at least one of acrylic compound and methacrylic compound" are hereinafter referred to as "(meth)acrylic compound".

Component (2) is a component for mainly rendering the resist flexible. Component (3) is a component for enhancing adhesion to copper. An inorganic filler, a fire retardant, a pigment, etc. may be appropriately added to the resist composition according to the present invention.

The present invention is also directed to the following embodiments:

2. The resist composition according to the above item 1, wherein said adhesion-enhancing agent (3) is at least one of a carboxyl benzotriazole and a phosphoric acid acrylate.

3. The resist composition according to the above item 1 or 2, wherein said curable composition is a curable composition (A) which comprises:
    (A1) at least one of an alkali-soluble acrylic compound and an alkali-soluble methacrylic compound, each having a carboxyl group;
    (A2) a polymerizable compound having one or more C=C unsaturated double bonds;
    (A3) an ultraviolet-ray polymerization initiator for said polymerizable compound (A2); and
    (A4) a thermal polymerization initiator for said polymerizable compound (A2).

4. The resist composition according to the above item 3, further comprising a sensitizer for ultraviolet-ray polymerization.

5. The resist composition according to any one of the above items 1 to 4, wherein said at least one alkali-soluble (meth)acrylic compound (1) has a carboxyl group.

6. The resist composition according to the above item 5, wherein said at least one alkali-soluble (meth)acrylic compound (1) is a reaction product of:
    a reaction product of an epoxy compound and an unsaturated monocarboxylic acid; and
    a polybasic acid anhydride.

7. The resist composition according to the above item 6, wherein said at least one alkali-soluble (meth)acrylic compound (1) is a carboxyl group-containing compound obtained by the reaction of at least one epoxy (meth)acrylate with a polybasic acid anhydride.

8. The resist composition according to the above item 1, wherein said adhesion-enhancing agent (3) is a thermosetting component comprising an epoxy compound containing at least two epoxy groups per molecule.

9. The resist composition according to the above item 8, wherein said curable composition is a curable composition (B) which comprises:
   (B1) a reaction product of:
      a reaction product of an epoxy compound and an unsaturated monocarboxylic acid; and
      a polybasic acid anhydride;
   (B2) an ultraviolet-ray polymerization initiator; and
   (B3) a volatile organic solvent.

10. A solder resist formed from a resist composition according to any one of the above items 1 to 9.

11. A solder resist film obtained by forming a resist composition according to any one of the above items 1 to 9 into sheet.

12. A printed circuit board having thereon a solder resist formed from a resist composition according to any one of the above items 1 to 9.

The resist composition according to the above item 3, i.e., comprising a curable composition (A) is hereinafter referred to as a "resist composition (A)". Having such an arrangement, the resist composition (A) has ultraviolet-ray curing property.

The resist composition according to the above item 9, i.e., comprising a curable composition (B) and containing the specific adhesion-enhancing agent (3) as defined in the above item 8 is hereinafter referred to as a "resist composition (B)".

Component (A1) constituting the resist composition (A) is a base material for mainly rendering the resist composition soluble in an alkaline solution. Components (A2) and (A3) each are a component for crosslinking the resist when irradiated with ultraviolet rays. Component (A4) is a component for thermally curing and reinforcing the resist.

Component (B1) constituting the resist composition (B) is a base material for rendering the resist composition soluble in an alkaline solution. Component (B2) is a component for crosslinking the resist when irradiated with an active energy ray such as ultraviolet ray. Component (B3) is an organic solvent for coating the resist composition.

The resist composition (A) according to the present invention can be applied onto a film and then dried to give a dry film type resist. Alternatively, the resist composition (A) can also be used as a liquid resist. Specifically, the resist composition (A) is applied onto a printed circuit board by a screen printing method, a curtain coating method or a roll coating method, irradiated with an active energy ray so as to cure necessary areas, followed by dissolving the unexposed areas away with a weakly alkaline aqueous solution to form a resist-patterned film. By thermally curing the resist-patterned film, a permanent film having a high flexibility and high heat resistance can be obtained.

On the other hand, the resist composition (B) is mainly used as a liquid resist. In other words, the epoxy group in the specific adhesion-enhancing agent (3) and the free carboxyl group present in the side chain of component (B1) undergo copolymerization reaction to provide a coating film having excellent properties such as high heat resistance, solvent resistance, plating resistance, adhesion to copper foil, electrical properties and hardness. In addition, the incorporation of the fine-particulate elastic polymer having a carboxyl group as component (2) makes it possible to obtain a resist composition which can hardly crack due to stress such as thermal shock, mechanical impact, warpage and twist. If the fine-particulate polymer is merely elastic, the resulting resist composition on unexposed areas after exposure and development is unwilling to be dissolved away. Therefore, the fine-particulate elastic polymer having a carboxyl group is used.

DETAILED DESCRIPTION OF THE INVENTION

The alkali-soluble (meth)acrylic compound used as component (1) in the resist composition according to the present invention is preferably a (meth)acrylic compound having a carboxyl group. Examples of such a (meth)acrylic compound having a carboxylic group include: linear polymers mainly comprising (meth)acrylic acid and (meth)acrylic acid ester (such polymers are hereinafter referred to as "unmodified acrylic polymer") and having a remaining carboxyl group derived from (meth)acrylic acid; and carboxyl group-containing compounds obtained by the reaction of at least one of an epoxy acrylate and an epoxy methacrylate (The terms "at least one of an acrylate and a methacrylate" are hereinafter referred to as "(meth)acrylate") with a polybasic acid anhydride.

Among these compounds, the unmodified acrylic polymer can be obtained by dissolving a (meth)acrylic acid ester (such as methyl (meth)acrylate, ethyl (meth)acrylate, butyl (meth)acrylate, hexyl (meth)acrylate, hydroxyethyl (meth)acrylate, hydroxypropyl (meth)acrylate and tetrahydrofurfuryl (meth)acrylate) and a (meth)acrylic acid at an appropriate proportion in an alcohol-based solvent such as isopropyl alcohol, ethylene glycol monoethyl ether and propylene glycol monomethyl ether, and then subjecting the solution to copolymerization in the presence of azobisisobutyronitrile, benzoyl peroxide or the like as an initiator.

Besides the above-described components such as (meth)acrylic acid and (meth)acrylic acid ester, other vinyl compounds such as styrene and acrylonitrile may be copolymerized to produce the unmodified acrylic compound. In particular, when the resist composition needs to be heat resistant and water resistant, styrene is preferably copolymerized in an amount of from 5 to 30% by weight based on the total weight of the monomers constituting the polymer.

Referring to the proportion of (meth)acrylic acid and other components in the unmodified acrylic polymer, the proportion of (meth)acrylic acid is preferably from 20 to 50% by weight based on the total weight of the monomers constituting the polymer. This is because the acid value of the final composition needs to be adjusted to a range of from 0.5 to 3.0 meq/g so as to render the uncured resist composition of the invention soluble in alkali, and also because that it is taken into consideration the case where the carboxyl groups in the unmodified acrylic polymer are partly used for the addition to a compound having glycidyl group and to a C=C unsaturated double bond.

A preferred example of component (1) is one obtained by adding, to some of the carboxyl groups in the unmodified acrylic polymer, a compound having a glycidyl group and a C=C unsaturated double bond per molecule.

The foregoing compound exerts an effect of rendering the resist composition of the invention insoluble and infusible when heated or irradiated with active energy ray such as an electron beam and ultraviolet ray that polymerizes the C=C double bonds and an effect of imparting sufficient mechanical properties required for printed circuit board. Specific examples of the foregoing compound include glycidyl (meth)acrylate, allyl glydicyl ether, vinyl benzyl glycidyl ether, and 4-glycidyloxy-3,5-dimethylbenzylacrylamide. Preferred among these compounds is glycidyl (meth) acrylate from the standpoint of availability and ease of addition reaction to carboxyl group.

Other glycidyl compounds such as bromated phenyl glycidyl ether as disclosed in JP-A-7-233226 may be used.

The molecular weight of the foregoing polymer is preferably from 5,000 to 100,000. When the molecular weight of the foregoing polymer falls below 5,000, the resulting polymer exhibits a deteriorated heat resistance. On the contrary, when the molecular weight of the foregoing polymer exceeds 100,000, the resulting resin tends to be hardly embedded into indented portions on a conductor circuit pattern in the process of the formation of a resist on a printed circuit board.

Component (1) includes products obtained by the reaction of: a reaction product of an epoxy compound and an unsaturated monocarboxylic acid; and a polybasic acid anhydride. These products are preferred examples of component (A1) for use in the resist composition (A) and also correspond to component (B1) for use in the resist composition (B). Preferred among these compounds is a carboxyl group-containing compound obtained by the reaction of epoxy (meth)acrylate with a polybasic acid anhydride. These compounds are alkali-soluble components having a carboxyl group. These compounds are excellent in insulating characteristics during moistening under pressure. More preferred compounds among these compounds are those which stays solid at room temperature because they can render the surface of coating film of resist composition tack-free. Preferred among the compounds which stay solid at room temperature are those having a softening point of from 20° C. to 120° C., preferably from 40° C. to 100° C.

The product of the reaction of an epoxy compound with an unsaturated monocarboxylic acid as a starting material can be normally produced by the reaction of a compound having at least one epoxy group per molecule with a compound having an unsaturated bond and a carboxyl group per molecule. This reaction product is a compound having an unsaturated bond and a hydroxyl group in its molecule. The reaction product, in case of an epoxy (meth)acrylate, can be produced generally by the reaction of an epoxy compound having at least one epoxy group per molecule with a compound having a (meth)acryloyl group and a carboxyl group per molecule. The product is a compound having a (meth)acryloyl group and a hydroxyl group in its molecule.

Component (1) for use in the invention is preferably a compound substantially free of unreacted epoxy group and having two or more unsaturated bonds. Component (1), in case of an epoxy (meth)acrylate, is preferably a compound obtained by synthesizing from an epoxy (meth)acrylate containing two or more (meth)acryloyl groups.

In the case where a compound containing unreacted epoxy group is used as a starting material, at the time when the hydroxyl group in the compound reacts with a polybasic acid anhydride, it also reacts with the existing epoxy group, making it more likely that the compound can undergo gelation, even during storage. Further, when the compound contains only one unsaturated bond such as (meth)acryloyl group, a coating film obtained by exposure exhibits a deteriorated mechanical strength, possibly causing peeling or meandering of the cured product during development.

Examples of the epoxy compound, as one of starting materials of the reaction product of an epoxy compound and an unsaturated monocarboxylic acid, such as epoxy (meth) acrylate, include bisphenol A type epoxy resins, bisphenol F type epoxy resins, bisphenol S type epoxy resins, phenol novolak type epoxy resins, cresol novolak type epoxy resins, glycidylamine type epoxy resins such as tetraglycidylaminodiphenylmethane, and alicyclic epoxy resins.

Examples of the compound containing an unsaturated group (such as a (meth)acryloyl group) and a carboxyl group to be reacted with the epoxy compound include acrylic acid and methacrylic acid. Other examples of the compound include reaction products of an acid anhydride such as phthalic anhydride and tetrahydrophthalic anhydride with a hydroxyl group-containing (meth)acrylate such as hydroxyethyl (meth)acrylate and pentaerythritol (meth)acrylate, and acrylic dimers.

From the standpoint of curability during exposure and heat resistance of final coating film, the epoxy compound is preferably a phenol novolak type epoxy resin or cresol novolak type epoxy resin, and the unsaturated monocarboxylic acid is preferably a (meth)acrylic acid.

The reaction of: the reaction product of an epoxy compound and an unsaturated monocarboxylic acid, such as epoxy (meth)acrylate; and the polybasic acid anhydride can be carried out under conditions already known as to the reaction of a compound having hydroxyl group with a polybasic acid anhydride. In some detail, the polybasic acid anhydride is reacted with the reaction product of an epoxy compound and an unsaturated monocarboxylic acid in an amount of from 0.1 to 1.0 mol, preferably from 0.2 to 0.9 mols per mol of the hydroxyl group in the reaction product of an epoxy compound and an unsaturated monocarboxylic acid.

When the proportion of the polybasic acid anhydride falls below 0.1 mol, the resulting resist composition of the invention exhibits a deteriorated developability with an alkaline aqueous solution. On the contrary, when the proportion of the polybasic acid anhydride to be reacted exceeds 1.0 mol, some amount of polybasic acid anhydride is left unreacted in component (1), causing the crystallization of unreacted polybasic acid anhydride or, in many cases, causing the reaction of hydroxyl group and unreacted polybasic acid anhydride left in component (1) during storage that may result in the deterioration of the storage stability of the resist composition.

Examples of the polybasic acid anhydride for use in the production of component (1) include maleic anhydride, phthalic anhydride, succinic anhydride, itaconic anhydride, citraconic anhydride, tetrahydrophthalic anhydride, hexahydrophthalic anhydride, 2,6-endomethylene tetrahydrophthalic anhydride, dodecylsuccinic anhydride, nonylsuccinic anhydride, and trimellitic anhydride. The reaction product of an epoxy compound such as epoxy (meth) acrylate and an unsaturated monocarboxylic acid may be reacted with a polybasic acid anhydride at a temperature of preferably from 50° C. to 150° C., more preferably from 80° C. to 120° C. for 0.1 to 10 hours, preferably 0.5 to 5 hours. This reaction may also be carried out in the presence of a known catalyst such as tertiary amine, quaternary ammonium salt, triethylamine and tetrabutylammonium bromide.

In the case where the resist composition of the invention is formed on a film to produce a dry film, component (1) is a component indispensable for the prevention of cracking of dry coating film of resist or falling of dry coating film from the copper foil. The amount of component (1) to be incorporated is preferably from 10 to 60% by weight based on the total weight of the resist composition of the invention.

Component (2), which is a fine-particulate crosslinked elastic polymer having a carboxylic group, is incorporated in the resist composition for the main purpose of being uniformly dispersed in the resin composition to form a structure corresponding to island in a sea-island structure and hence impart crack resistance to the cured resist. In other words, even when the cured resist is subject to impact at ordinary temperature or stress during heating to undergo partial destruction, the destruction doesn't extend any longer because cracking stops at the interface of the island structure in the sea-island structure, i.e., the fine particulate elastic polymer, making it difficult to cause cracking.

The average particle diameter of the fine-particulate crosslinked elastic polymer is preferably less than 1 $\mu$m as determined by the volume standard method. When the average particle diameter of the fine-particulate crosslinked elastic polymer exceeds 1 $\mu$m, the resulting fine-particulate crosslinked elastic polymer exhibits a deteriorated dispersibility in the resin varnish obtained by mixing the curable resin composition constituting the resist composition of the invention with a solvent. More preferably, the average particle diameter of the fine-particulate crosslinked elastic polymer is less than 0.1 $\mu$m.

Examples of component (2) include crosslinked acryl rubbers having a carboxyl group, crosslinked NBRs having a carboxyl group, and crosslinked MBS resins having a carboxyl group.

Preferred among these compounds are crosslinked acryl rubbers having a carboxyl group and crosslinked NBRs having a carboxyl group, which are soluble in an alkaline aqueous solution, because they contribute to the enhancement of adhesion between the insulation layer and the deposited metal. Even more preferred among these compounds are crosslinked acryl rubbers because it is readily available and improves both the insulating properties of the cured resist of the invention and the alkali solubility of the uncured resist composition.

The amount of component (2) to be incorporated is preferably from 5 to 40% by weight based on the total weight of the resist composition of the invention to provide the resulting cured resist with a sufficient impact resistance. In the case where component (2) is incorporated in an amount of more than 40% by weight, there is no problem on impact resistance. However, when the resist composition of the invention is mixed with a solvent to prepare a resin varnish, component (2) is readily separated, causing the deterioration of the stability of varnish or the generation of uneven coating or bubbles during the application and drying to inner layer panel to disadvantage.

In the case where the resist composition of the invention is mixed with a solvent to prepare a resin varnish, component (2), if soluble in the solvent in the varnish, aggregates and thus is hardly dispersed uniformly in the solvent. The resulting aggregates tend to remain undissolved during dissolution in an alkali.

Further, when component (2) is completely dissolved in the resin varnish, no portions corresponding to the island in the foregoing sea-island structure are formed, making it easy to cause cracking. Also, since a flexible component attributed to component (2) remain also in the sea in the sea-island structure, the resulting cured resist exhibits a lowered glass transition temperature (Tg) and hence deteriorated physical properties at high temperatures to disadvantage. Therefore, component (2) is preferably insoluble or difficultly soluble in the solvent used for the production of the resin varnish described later. In some detail, component (2) can take a crosslinked structure so that it is insoluble or difficultly soluble in the solvent.

Component (2) can take a crosslinked structure also for the purpose of exerting an effect of enhancing its stability in the resin varnish.

The use of component (2) in combination with component (A1) for use in resist composition (A) or component (B1) for use in resist composition (B) remarkably improves the solubility of the uncured resist composition according to the present invention at the time of dissolving it away with an alkaline aqueous solution or the like. This is because component (2) has a carboxyl group and thus is originally excellent in alkali solubility. Additionally, this is also because component (2) is crosslinked and thus can be readily dispersed with forming a sea-island pattern in the resist composition of the invention.

When the fine-particulate elastic polymer having a carboxyl group is uncrosslinked, it is mixed with the reaction product of an epoxy compound and an unsaturated monocarboxylic acid and with other components such as a crosslinking agent and thus cannot form a sea-island pattern. Accordingly, the resulting resin composition exhibits a deteriorated solubility when dissolved away with an alkaline aqueous solution. Further, the resin composition of the invention readily causes cracking when cured.

Even in the case where the crosslinked elastic polymer is free of a carboxyl group, the resulting uncured resist resin layer can be removed owing to the carboxyl group contained in component (1). However, the crosslinked elastic polymer can be hardly dissolved uniformly in the solvent. Thus, the uncured resist resin layer in such a case is removed in such a manner that a resin swollen is peeled off by the force of spray from the alkaline developing machine. Accordingly, in the case where development with an alkali is effected, if the fine-particulate crosslinked elastic polymer free of a carboxyl group is used instead of component (2) in the present invention, the surface of the resist wall has an extremely deteriorated shape that remarkably deteriorates the resist resolution.

The method for dispersing component (2) in the resist composition of the invention is preferably as follows. Respective components are previously subjected to dispersion in a solvent such as methyl ethyl ketone by a homomixer, followed by blending with other components constituting the resist composition of the invention. Alternatively, component (2), a solvent and other components are blended and then subjected to dispersion by a homomixer or like means so that the secondary aggregates of the fine particles are disaggregated. As other means there may be preferably used three-roll mill, ball mill, etc.

If the resist composition of the invention is processed into a varnish with the secondary aggregates being not sufficiently disaggregated, component (2) is separated from the other components in the resin varnish to remarkably deteriorate the storage stability of the varnish. Even when this varnish is applied to an inner layer panel having a conductor circuit pattern formed thereon, a uniform coating film can be hardly obtained, possibly deteriorating the reliability in insulating properties.

The resist composition of the invention comprises as component (3) an adhesion improver incorporated therein for the purpose of enhancing the adhesion with respect to copper. If the resist composition is free of adhesion improver, the cured portion of the resist which comes to contact with copper can hardly be rendered resistant to heat because of the deterioration reaction caused by heat with the action of copper as a catalyst. Accordingly, it is necessary to form a stable barrier made of, for example, nickel, palladium or gold between copper and the cured resist. However, the incorporation of an adhesion improver makes it possible to secure the desired adhesion between copper and the cured resist without the necessity of such a barrier.

The agent for enhancing adhesion to copper, i.e., component (3), for use in the present invention is preferably at lease one of a carboxyl benzotriazole and a phosphoric acid acrylate.

The carboxyl benzotriazole is a compound having a —COOR group (in which R represents a hydrogen atom, an alkaline metal or a $C_{1-12}$ alkyl group) connected to carbon in the benzene ring in the benzotriazole, which is not connected to nitrogen atom. In the present invention, the carboxyl benzotriazole preferably has one —COOH group to enhance the adhesion between the cured resist and copper. The preferred amount of the carboxyl benzotriazole to be incorporated is from 1 to 10 parts by weight based on 100 parts by weight of the resist composition of the invention. As for the carboxyl benzotriazole, when the amount thereof to be incorporated falls below 1 part by weight, the adhesion-enhancing effect is poor. On the contrary, when the amount of the carboxyl benzotriazole to be incorporated exceeds 10 parts by weight, the resulting cured resist tends to have a deteriorated heat resistance. As for the phosphoric acid acrylate, when the amount thereof to be incorporated falls below 1 part by weight, it hardly exerts the effect of enhancing the adhesion to copper. On the contrary, when the amount of the phosphoric acid acrylate to be incorporated exceeds 10 parts by weight, the resulting resist composition is moistened to have a lowered insulating resistance to disadvantage.

The adhesion improver, i.e., component (3) is preferably a thermosetting component comprising a compound having two or more epoxy groups per molecule, particularly in the case of the resist composition (B). Specific examples of such a thermosetting component include bisphenol A type epoxy resins, bisphenol F type epoxy resins, bisphenol S type epoxy resins, phenol novolak type epoxy resins, cresol novolak type epoxy resins, glycidyl novolak type epoxy resins such as tetraglycidylaminophenylmethane and alicyclic epoxy resins. A small amount of a curing accelerator such as amine compounds, imidazole compounds, carboxylic acids, phenols, quaternary ammonium salts and methylol group-containing compounds may be used in combination therewith to accelerate the reaction.

The epoxy group contained in the foregoing component can readily react with component (1), particularly with the carboxyl group in the reaction product of: the reaction product of an epoxy compound and an unsaturated monocarboxylic acid; and the polybasic acid anhydride, to thereby lower the water absorption of the resist composition of the invention as well as enhance the adhesion to copper.

The amount of component (3) to be incorporated is preferably from 10 to 60 parts by weight, more preferably from 20 to 50 parts by weight based on 100 parts by weight of the resist composition of the invention. The amount of the curing accelerator to be incorporated is preferably from 1 to 12 parts by weight based on 100 parts by weight of the third component.

The resist composition of the invention preferably further comprises the following components.

Polymerizable Compound:

The resist composition (A) comprises as component (A4) a polymerizable compound having one or more C=C unsaturated double bonds. The foregoing polymerizable compound is a compound having acryloyl group, methacryloyl group, allyl group, vinyl group or the like. Similarly, the resist composition (B) may comprise as a desirable component a compound having one or more acryloyl groups and/or methacryloyl groups (hereinafter referred to as "(meth) acryloyl group") to adjust the viscosity thereof or enhance the curability thereof with ultraviolet ray.

Specific examples of the compound having one or more (meth)acryloyl groups include β-hydroxyethyl (meth) acrylate, β-hydroxypropyl (meth)acrylate, glycidyl (meth) acrylate, dimethylaminoethyl (meth)acrylate, diethylaminoethyl (meth)acrylate, ethylene glycol di(meth)acrylate, diethylene glycol di(meth)acrylate, triethylene glycol di(meth)acrylate, polyethylene glycol di(meth) acrylate, propylene glycol di(meth)acrylate, dipropylene glycol di(meth)acrylate, tripropylene glycol di(meth)acrylate, polypropylene glycol di(meth)acrylate, trimethylolpropane di(meth)acrylate, trimethylolpropane tri(meth)acrylate, pentaerythritol tri(meth)acrylate, pentaerythritol tetra(meth) acrylate, dipentaerythritol tetra(meth)acrylate, dipentaerythritol penta(meth)acrylate, dipentaerythritol hexa(meth) acrylate, tris-2-acryolyloxyethyl isocyanurate, polyester having a polymerization degree of 1 or more comprising a polybasic acid and hydroxylacryl (meth)acrylate, and epoxy (meth)acrylate and urethane (meth)acrylate having one or more (meth)acrylyol groups per molecule.

Examples of the compound having one double bond, except for the foregoing (meth)acrylate compounds, include compounds having a vinyl group such as styrene and acrylonitrile, compounds having an allyl group such as allyl phenol and eugenol, and compounds having a maleimide group such as N-phenylmaleimide, p-hydroxy-N-phenylmaleimide and p-chloro-N-phenylmaleimide. Examples of the compound having two double bonds include vinyl compounds such as divinylbenzene, allyl compounds such as diallyl phthalate and diallylether of bisphenol A, and triallyl isocyanurate.

Preferred among the foregoing compounds are compounds which has a long distance between crosslinked points to give a flexible cured product such as polypropylene glycol di(meth)acrylate. Also preferred among the foregoing compounds are urethane (meth)acrylate, polypropylene glycol di(meth)acrylate, polyethylene glycol di(meth)acrylate, trimethylol propane tri(meth)acrylate and pentaerythritol tri(meth)acrylate from the standpoint of compatibility with component (1). The amount of these compounds to be incorporated is preferably from 10 to 200 parts by weight based on 100 parts by weight of component (1) to enhance the heat resistance of the cured resist composition (hereinafter referred to as "cured resist").

Ultraviolet-ray Polymerization Initiator:

Ultraviolet-ray polymerization initiators are also called as "photopolymerization initiator" and known to initiate radical polymerization when irradiated with ultraviolet rays or the like. This component is used as component (A3) in the resist composition (A) and as component (B2) in the resist composition (B) Specific examples of the ultraviolet ray polymerization initiator include benzoinether-based compounds such as benzyl, benzoin, benzoin alkylether and 1-hydroxycyclohexyl phenyl ketone; ketal-based compounds such as benzyl dialkylether; acetophenone-based compounds such as 2,2'-diarykoxyacetophenone, 2-hydroxyacetophenone, p-t-butyltrichloroacetophenone and p-t-butyl dichloroacetophenone; benzophenone-based compounds such as benzophenone, 4-chlorobenzophenone, 4,4'-dichlorobenzophenone, 4,4'-bisdimethylaminobnzophenone, o-benzoyl methyl benzoate, 3,3'-dimethyl-4-methoxy benzophenone, 4-benzoyl-4'-methyldiphenylsulfide, dibenzosuberone and benzimethyl ketal; and thioxanthone-based compounds such as thioxanthone, 2-chlorothioxanthone, 2-alkylthioxanthone, 2,4-dialkylthioxanthone, 2-alkylanthraquinone and 2,2'-dichloro-4-phenoxyacetone.

The amount of the ultraviolet-ray polymerization initiator to be incorporated is preferably from 0.5 to 10 parts by weight based on 100 parts by weight of the resist composition (A) of the invention. When the amount of the ultraviolet-ray polymerization initiator to be incorporated falls below 0.5 parts by weight, the reaction cannot be sufficiently initiated. On the contrary, when the amount of the ultraviolet-ray polymerization initiator to be incorporated exceeds 10 parts by weight, the resulting cured resist can readily become brittle.

As for the resist composition (B) of the invention, the amount of the ultraviolet-ray polymerization initiator to be incorporated is preferably from 0.2 to 20 parts by weight, more preferably from 2 to 10 parts by weight based on 100 parts by weight of the sum of the amounts of the solid contents, i.e., component (B1), component (2) and component (3).

When the amount of the ultraviolet-ray polymerization initiator to be incorporated falls below 0.2 parts by weight, the coating film obtained by exposure exhibits a reduced mechanical strength, causing peeling or meandering of the cured product upon exposure. On the contrary, when the amount of the ultraviolet-ray polymerization initiator to be incorporated exceeds 20 parts by weight, the photopolymerization initiator which has not been used in exposure remain in the resulting coating film in a large amount, occasionally deteriorating physical properties such as heat resistance of the coating film.

Ultraviolet-ray Polymerization Sensitizer:

An ultraviolet-ray polymerization sensitizer is desirably incorporated in the resist composition (A) and in the resist composition (B) as component (4). The ultraviolet-ray polymerization sensitizer is preferably used in combination with the ultraviolet-ray polymerization initiator. Examples of such an ultraviolet-ray polymerization sensitizer include Nissoucre EPA, EMA, IAMA, EHMA, MABP and EABP (produced by Shinniso Kako K.K.), Kayacure EPA, DETX and DMBI (produced by Nippon Kayaku Co., Ltd.), Quntacure EPD, BEA, EOB and DMB (produced by Ward Blenkinsop Inc.), DABA (produced by Osaka Organic Chemistry Industry Ltd.), and PAA and DAA (produced by Daito Chemical Industries, Ltd.). The amount of the ultraviolet-ray polymerization sensitizer to be incorporated is preferably from 0.5 to 10 parts by weight based on 100 parts by weight of the resist composition of the invention. When the amount of the ultraviolet-ray polymerization sensitizer to be incorporated falls below 0.5 parts by weight, the reaction rate of ultraviolet-ray curing cannot be improved. On the contrary, when amount of the ultraviolet-ray polymerization sensitizer to be incorporated exceeds 10 parts by weight, the reaction rate of ultraviolet-ray curing is raised, reducing the shelf life.

Thermal Polymerization Initiator:

A thermal polymerization initiator is incorporated as component (A4) of the resist composition (A) and desirably incorporated also in the resist composition (B). Examples of such a thermal polymerization initiator include organic peroxide-based compounds and azobis-based compounds. Preferred among these compounds is dialkyl peroxides because they exhibit a high decomposition initiation temperature and hence a good storage stability and because they produce little low-molecular weight volatile components when decomposed. Specific examples of such dialkyl peroxides include dicumyl peroxide, t-butylcumyl peroxide, 2,5-dimethyl-2,5-di(t-butylperoxy)hexane, and 2,5-dimethyl-2,5-di (t-butylperoxy)hexyne. The amount of the thermal polymerization initiator to be incorporated is preferably from 0.5 to 5 parts by weight based on 100 parts by weight of the resist composition of the invention. When the amount of the thermal polymerization initiator to be incorporated falls below 0.5, it results in insufficient polymerization. On the contrary, when the amount of the thermal polymerization initiator to be incorporated exceeds 5 parts by weight, it reduces the shelf life of the resist composition and further a large amount of the decomposed substances of the thermal polymerization initiator generates, possibly deteriorating heat resistance.

Solvent:

The resist composition (B) of the invention comprises as component (B3) a volatile organic solvent to give a viscosity suitable for printing. The term "volatile" as used herein means that the concentration of the organic solvent in the coating resist layer reaches not more than 1% when heated at a temperature of from 60° C. to 100° C. for 10 to 30 minutes. Specific examples of the volatile organic solvent include: ketones such as methyl ethyl ketone and cyclohexanone; aromatic hydrocarbons such as toluene and xylene; cellosolves such as cellosolve and butyl cellosolve; carbitols such as carbitol and butyl carbitol; and ester acetates such as ethyl acetate, butyl acetate, cellosolve acetate, butyl cellosolve acetate, carbitol acetate and butyl carbitol acetate. These solvents may be used singly or in admixture.

On the other hand, as the solvent to be used to process the resist composition (A) into a resin varnish for forming a dry film, there is preferably used those which dissolve the respective components other than component (2) therein as well as volatilize with heat and within time of such an extent that the resist composition after coating does not polymerized. Specifically, solvents having a boiling point of lower than 100° C. such as methyl ethyl ketone, ethanol and isopropyl alcohol may be used. The solvent is preferably incorporated in such an amount that the solid content concentration of the resin varnish is from 30 to 80% by weight.

In order to prepare a liquid resist ink, it may be suffice to replace the solvent in the foregoing resin varnish by a high boiling solvent such as cellosolves (e.g., cellosolve, butyl cellosolve), carbitols (e.g., carbitol, butyl carbitol) and ester acetates (e.g., cellosolve acetate, ethylcarbitol acetate, butylcarbitol acetate, butylcellosovle acetate).

Fire Retardant:

The resist composition of the invention preferably further comprise as component (5) a reaction product of glycidyl ether of halogenated phenol compound and (meth)acrylic acid, and/or as component (6) phosphorus or a phosphoric fire retardant in order to impart fire retardancy thereto.

Specific examples of component (5), i.e., the reaction product of glycidyl ether of halogenated phenol compound and (meth)acrylic acid, include reaction products of tetrabromobisphenol A diglycidyl ether and (meth)acrylic acid, and reaction products of an epoxy resin having both tetrabromotinphenol A skeleton and bromine-free bisphenol A (e.g., DER514, produced by Dow Chemical) and (meth) acrylic acid. If necessary, two or more of these compounds may be used in combination. Further, compounds having different number of substituted bromine atoms per bisphenol A skeleton such as monobromo- or bibromo-form contained as by-products of tetrabromobisphenol A may be present therein.

Further, reaction products of a monofunctional bromated epoxy resin (BROC Series, produced by Nippon Kayaku Co., Ltd.) and (meth)acrylic acid, and reaction products of a polyfunctional bromated epoxy resin (BREN Series, produced by Nippon Kayaku Co., Ltd.) and (meth) acrylic acid may also be used. Preferred among these compounds are bifunctional compounds because they can impart strength and suitable flexibility in combination to the resist composition of the present invention. Referring to the kind of halogen, bromine is particularly preferred because it is excellent in fire retardance. The amount of component (5) to be incorporated is preferably such an amount that the bromine content in the resist composition is from 5 to 25% by weight.

When the content of bromine falls below 5% by weight, the resulting cured resist cannot be rendered sufficiently fire retardant unless phosphorus derived from component (6) described below is incorporated in an amount of not lower than 2% by weight. However, when phosphorus is incorporated in a large amount, it deteriorates insulating properties and hence is not preferred. On the contrary, when the amount of bromine to be incorporated exceeds 25% by weight, the resulting resist composition exhibits fire retardance but the halogen compound is readily released when heated, undesirably deteriorating the solder heat resistance or prolonged period reliability thereof. In order to prevent this trouble, the following phosphoric acid esters may be used as well.

Specific examples of the phosphoric acid ester to be used as component (6) include tricresyl phosphate, tri(2,6-dimethylphenyl)phosphate (PX130, produced by Daihachi Chemical Industry Co., Ltd.), and triaryl phosphate (Reophos, produced by Ajinomoto Co., Inc.). If necessary, two or more of these compounds may be used in combination. Further, red phosphorus which is the elementary phosphorus is also exhibits a high fire retarding effect. It may be used in the form of fine powder such as Hishiguard CP (produced by Nippon Chemical Industry Co., Ltd.).

Component (6) is preferably incorporated in such an amount that the phosphorus content in the resist composition of the invention is from 0.1 to 2% by weight.

When the phosphorus content falls below 0.1% by weight, a desired fire retardance cannot be obtained unless the bromine compound is incorporated more. If the bromine compound is incorporated more, a large amount of decomposed substances of halogenated compounds is produced during soldering, rendering the heat resistance of the resist composition of the invention insufficient. On the contrary, when the phosphorus content exceeds 2% by weight, it tends to deteriorate the electrical insulation property of the resist composition.

The resist composition of the invention may further comprise a commonly used inorganic filler such as talc, clay and silica or additives such as leveling agent, anti-foaming agent, pigment and ion scavenger as necessary. The inorganic filler is preferably incorporated in an amount of from 5 to 30 parts by weight based on 100 parts by weight of the resist composition of the invention. Examples of the pigment include phthalocyanine blue, phthalocyanine green, and carbon black.

In forming a resist of the resist composition according to the invention on a printed circuit board, the resist is preferably formed on the surface of copper after polishing thereof and before the formation of an oxide film on the copper foil surface, because it gives much adhesion. In addition, further enhanced adhesion can be obtained by performing, prior to the formation of resist, oxidization or roughening treatment of the copper foil surface to form unevenness.

The resist composition of the invention is excellent in both adhesion with respect to copper and heat resistance, and thus is particularly useful as a solder resist. Furthermore, workability can be considerably improved by imparting ultraviolet-ray curing property to the curable resin composition, which is a main component of the resist composition according to the invention, to provide a photoresist composition.

EXAMPLE

The present invention will be illustrated in greater detail with reference to the following Examples, but the invention should not be construed as being limited thereto.

Comparative Example 1
Synthesis of Component (1)-1:

A mixture of 48 parts by weight of methyl acrylate, 29 parts by weight of styrene, 23 parts by weight of acrylic acid and 0.25 parts by weight of azobisisobutyronitrile was added dropwise to 100 parts by weight of a 7:3 mixture of methyl ethyl ketone and ethanol which had been kept at a temperature of 75° C. in a nitrogen atmosphere in 5 hours. The mixture was then subjected to ripening for 0.5 hours. To the mixture were then added 0.3 parts by weight of azobisisobutyronitrile. The mixture was then subjected to ripening for 4 hours to synthesize an unmodified acrylic polymer. To the mixture were then added 0.23 parts by weight of hydroquinone as a polymerization inhibitor. To the mixture were then added dropwise 1.5 parts by weight of N,N-dimethylbenzylamine and 14.7 parts by weight of glycidyl methacrylate while air was being blown therethrough at a slight rate. Under these conditions, the reaction mixture was allowed to undergo reaction at a temperature of 77° C. for 10 hours to synthesize a carboxyl group-containing component (1)-1 having a molecular weight of from 15,000 to 50,000, an acid value of 1.81 meq/g and an unsaturated group content of 0.9 mol/kg.

Preparation of Resist Composition:

30 parts by weight (as calculated in terms of solid content) of component (1)-1 thus synthesized, 5 parts by weight of a polyethylene glycol diacrylate, 10 parts by weight of a carboxyl group-modified crosslinked acryl rubber having an average particle diameter of 0.07 µm (DHS2, produced by JSR Corporation), 40 parts by weight (as calculated in terms of solid content) of bromated bisphenol A-epoxy methacrylate (bromine content in the solid content: about 38%), 5 parts by weight of a photopolymerization initiator (Irgacure 907, produced by Ciba Geigy Inc.), 2 parts by weight of a photopolymerization sensitizer (Kayacure EPA, produced by Ciba Geigy Inc.), 7.0 parts by weight of phosphoric acid ester (Reophos, produced by Ajinomoto Co., Inc.), 1.0 parts by weight of a heat curing agent (Perhexine 25B, produced by NOF Corp.), and 75 parts by weight of methyl ethyl ketone were thoroughly mixed by means of a homodisper (produced by Tokushu Kika Kogyo Co., Ltd.) to prepare a resin composition. To the resin composition was then added methyl ethyl ketone so that the viscosity thereof was adjusted to about 700 cps. The resin composition was then filtered through a filter cloth having 300 pores to prepare a resin varnish A.

Example 1

A resin varnish B was prepared in the same manner as in Comparative Example 1, except that 3 parts by weight of a carboxyl benzotridiol (hereinafter referred to as "monocarboxylic acid benzotriazole") was additionally added during the preparation of the resin varnish.

Example 2

A resin varnish C was prepared in the same manner as in Comparative Example 1, except that 3 parts by weight of a carboxyl benzotridiol and 6 parts by weight of a phosphoric acid acrylate were additionally added during the preparation of the resin varnish.

Comparative Example 2

A resin varnish D was prepared in the same manner as in Comparative Example 1, except that the carboxyl group-modified crosslinked acryl rubber having an average particle diameter of 0.07 μm was not blended.

Example 3
Synthesis of Component (1)-2:

Into a four-neck flask equipped with a thermometer, a stirrer and a condenser were charged 859 g (4.08 epoxy equivalents) of a phenol novolak type epoxy resin YDPN-704 (produced by Toto Kasei K.K.) and 624 g of ethyl acetate as a solvent. The mixture was then heated to a temperature of 110° C. to obtain a homogeneous solution. To the solution thus obtained were then added 0.52 g of phenothiazine as a polymerization inhibitor, 10.4 g of tetrabutylammonium bromide as a catalyst, and 294 g (4.08 carboxyl equivalents) of acrylic acid. The reaction mixture was then allowed to undergo reaction at a temperature of 110° C. while air was being blown therethrough to produce an epoxy acrylate. The percent consumption of acrylic acid was measured by measuring the acid value of the reaction solution. As a result, the decrease of acid value stopped after about 9 hours. The percent consumption of acrylic acid calculated from acid value reached approximately 100%. To the epoxy acrylate solution thus obtained was then added 302 g (2.0 mols) of phthalic anhydride. The reaction solution was then allowed to undergo reaction at a temperature of 110° C. After the complete dissolution of phthalic anhydride in the reaction solution, the reaction solution was further allowed to undergo reaction for 3 hours. To the solution was then added 159 g of methyl ethyl ketone. As a result, component (1)-2 containing a carboxyl group was obtained in the form of 65% (as calculated in terms of solid content) solution of a product of reaction of epoxy acrylate with polybasic acid anhydride.

Preparation of Resist Composition:

30 parts by weight (as calculated in terms of solid content) of component (1)-2 thus synthesized, 5 parts by weight of a polyethylene glycol diacrylate, 10 parts by weight of a carboxyl group-modified crosslinked acryl rubber having an average particle diameter of 0.07 μm (DHS2, produced by JSR Corporation), 40 parts by weight (as calculated in terms of solid content) of bromated bisphenol A-epoxy methacrylate (bromine content in the solid content: about 38%), 5 parts by weight of a photopolymerization initiator (Irgacure 907, produced by Ciba Geigy Inc.), 2 parts by weight of a photopolymerization sensitizer (Kayacure EPA, produced by Ciba Geigy Inc.), 7.0 parts by weight of phosphoric acid ester (Reophos, produced by Ajinomoto Co., Inc.), 1.0 parts by weight of a heat curing agent (Perhexine 25B, produced by NOF Corp.), and 75 parts by weight of methyl ethyl ketone were thoroughly mixed by means of a homodisper (produced by Tokushu Kika Kogyo Co., Ltd.) to prepare a resin composition. To the resin composition was then added methyl ethyl ketone so that the viscosity thereof was adjusted to about 700 cps. The resin composition was then filtered through a filter cloth having 300 pores to prepare a resin varnish E.

Production of Resist Film:

The foregoing five resin varnishes were each applied onto a release agent-uncoated surface of a 50-μm thick polyethylene terephthalate (PET) film having a release agent coated on one surface thereof by means of a bar coater, dried at a temperature of 70° C. for 10 minutes, and then dried at a temperature of 110° C. for 5 minutes so that the solvent was evaporated away to form a resin layer thereon to a thickness of about 80 μm. Thus, a resist film was prepared.

Formation of Resist:

A copper-clad laminate having a 35 μm copper foil was etched to prepare a printed circuit board. The printed circuit board thus obtained was then separately subjected to the following two surface treatments to provide two kinds of treated printed circuit boards.

The copper surface was subjected to buffing.

The copper surface was treated with a special chemical to form numerous fine holes therein (hereinafter referred to as "MEB"). The depth of the holes was about 1.5 μm.

Subsequently, the foregoing resist film was vacuum-laminated on the thus treated printed circuit board at a temperature of 70° C. and a pressure of 3 Torr. Thereafter, PET film was peeled off from the laminate. The laminate was then exposed to ultraviolet rays at 500 mJ and developed with a 1% aqueous solution of sodium carbonate at a temperature of 30° C. to form a solder resist. Subsequently, the solder resist was thermally cured at a temperature of 170° C. for 30 minutes.

Subsequently, the printed circuit board sample thus prepared was subjected to pencil hardness test and crosscut test according to JIS-D0202. Further, the sample was floated on a molten solder bath having a temperature of 260° C. to observe if the solder resist was separated or peeled off from the printed circuit board. The results are shown in Table 1.

The printed circuit board sample was then measured for surface insulating resistance according to J pattern in test pattern for multi-layer printed circuit board defined in JIS-C5012. As a result, all the samples showed an initial surface insulating resistance of from $10^{12}$ to $10^{13}$ Ω and a surface insulating resistance of from $10^{11}$ to $10^{12}$ Ω after moistening (C-96/850/85, BIAS 50VDC).

As a result of pressure cooker test (PCT, 121° C., 98%RH, 2 atm., 24 hours), Comparative Examples 1 and 2 and Examples 1 and 2 showed an insulating resistance of $10^{10}$ to $10^{11}$ Ω while Example 3 showed an insulating resistance of $10^{11}$ to $10^{12}$ Ω, which is one digit higher than the formers.

The samples were each subjected to thermal cycle test (1 cycle: at −55° C. for 30 min. and at 125° C. for 30 min.) over 300 cycles. As a result, none of the samples showed cracking on the solder resist.

The samples were each placed in a minidisc press produced by Kamekura Seiki K.K. in such an arrangement that the male half of the press comes in contact with the cured resist of the invention. The sample was then punched by a 2-cm square-punching die. The substrate (2-cm square) thus dropped was then observed for cracking. As a result, none of the samples showed cracking. The samples were each floated on a 260° C. solder bath for 180 seconds, and then immediately observed for cracking on the insulation layer. As a result, none of the samples showed cracking. The samples were each also cut and subjected to test according to UL94. As a result, all the samples were observed to be on UL94V-0 level.

TABLE 1

| | Varnish compo-sition | Copper surface treatment | Pencil hard-ness | Cross hatch | Peeling of resist (sec) Solder float 260° C. | | | | 260° C. 180 sec | Crack Thermal cycle | Press | Surface insulating resistance C96/20/65 | C96/85/85/ 50VDC | PCT 121° C. 2 atm., 24 H | Fire retar-dance UL94 |
|---|---|---|---|---|---|---|---|---|---|---|---|---|---|---|---|
| | | | | | 10 | 30 | 60 | 180 | | | | | | | |
| Example 1 | B | Polished | 4 H | OK | G | G | P | P | G | G | G | $10^{12}$–$10^{13}$ | $10^{11}$–$10^{12}$ | $10^{10}$–$10^{11}$ | 94V-0 |
| | | MEB | 4 H | OK | G | G | G | G | G | G | G | | | | |
| Example 2 | C | Polished | 4 H | OK | G | G | G | G | G | G | G | $10^{12}$–$10^{13}$ | $10^{11}$–$10^{12}$ | $10^{10}$–$10^{11}$ | 94V-0 |
| | | MEB | 4 H | OK | G | G | G | G | G | G | G | | | | |
| Example 3 | E | Polished | 4 H | OK | G | G | G | G | G | G | G | $10^{12}$–$10^{13}$ | $10^{11}$–$10^{12}$ | $10^{11}$–$10^{12}$ | 94V-0 |
| | | MEB | 4 H | OK | G | G | G | G | G | G | G | | | | |
| Comparative Example 1 | A | Polished | 3 H | OK | G | P | P | P | G | G | G | $10^{12}$–$10^{13}$ | $10^{11}$–$10^{12}$ | $10^{10}$–$10^{11}$ | 94V-0 |
| | | MEB | 3 H | OK | G | G | G | P | G | G | G | | | | |
| Comparative Example 2 | D | Polished | 5 H | OK | G | P | P | P | P | P | P | $10^{12}$–$10^{13}$ | $10^{11}$–$10^{12}$ | $10^{10}$–$10^{11}$ | 94V-0 |
| | | MEB | 5 H | OK | G | P | P | P | P | P | P | | | | |

Peeling of resist: G: Nothing peculiar; P: Peeled
Crack: G: Nothing peculiar; P: Cracked

Example 4

Synthesis of Component (1)-3:

Into a four-neck flask equipped with a thermometer, a stirrer and a condenser were charged 850 g (4.08 epoxy equivalents) of a phenol novolak type epoxy resin YDPN-704 (produced by Toto Kasei K.K.) and 624 g of butyl cellosolve acetate as a solvent. The mixture was then heated to a temperature of 110° C. to obtain a homogeneous solution.

To the solution thus obtained were then added 0.52 g of phenothiazine as a polymerization inhibitor, 10.4 g of tetrabutylammonium bromide as a catalyst, and 294 g (4.08 carboxyl equivalents) of acrylic acid. The reaction mixture was then allowed to undergo reaction at a temperature of 110° C. while air was being blown therethrough to produce an epoxy acrylate. The percent consumption of acrylic acid was measured by measuring the acid value of the reaction solution. As a result, the decrease of acid value stopped after about 9 hours. The percent consumption of acrylic acid calculated from acid value reached approximately 100%. To the epoxy acrylate solution thus obtained was then added 302 g (2.0 mols) of phthalic anhydride. The reaction solution was then allowed to undergo reaction at a temperature of 110° C. After the complete dissolution of phthalic anhydride in the reaction solution, the reaction solution was further allowed to undergo reaction for 3 hours. To the solution was then added 159 g of butyl cellosolve acetate. As a result, a product of reaction of epoxy acrylate with polybasic acid anhydride (component (1)-3) was obtained in the form of 65% (as calculated in terms of solid content) solution.

Preparation of Resist Composition:

To 100 parts by weight (solid content) of component (1)-3 thus obtained were added the following other components in the following proportions. The mixture was then kneaded by means of a three-roll mill to prepare a resist composition having a solid content of 66%.

Ultraviolet-ray polymerization initiator:
  5 parts by weight of 2-methyl(4-(methylthio)phenyl)-2-morpholino-1-propanone (Irgacure 907, produced by Ciba Geigy Inc.); and
  2 parts by weight of 2,4-diethylthioxanthone (Kayacure DETEX, produced by Nippon Kayaku Co., Ltd.)

Thermosetting component:
  80 parts by weight of bisphenol A type epoxy resin produced by Yuka Shell Epoxy Co., Ltd. (trade name: Epicoat 1001)

Fine-particulate elastic polymer:
  40 parts by weight of acryl rubber fine particles "DHS2" (produced by Nippon Synthetic Chemical Industry Co., Ltd.)

Solvent:
  20 parts by weight of butyl cellosolve acetate

Fire retardant:
  40 parts by weight of bromated epoxy methacrylate

Auxiliary fire retardant:
  6 parts by weight of phosphoric acid ester

The resist composition thus prepared was applied to a copper through-hole printed circuit board by a screen printing method to a thickness of from 20 to 30 μm, and then dried at a temperature of 75° C. for 30 minutes. The coating film thus prepared was then exposed to light from a photosolder double-sided exposure equipment through a photomask at a dose of 500 mJ/cm$^2$.

Comparative Example 3

To 100 parts by weight (solid content) of component (1)-3 prepared in Example 4 added the following other components in the following proportions. The mixture was then kneaded by means of a three-roll mill to prepare a resist composition having a solid content of 66%.

Photopolymerization initiator:
  5 parts by weight of 2-methyl(4-(methylthio)phenyl)-2-morpholino-1-propanone (Irgacure 907, produced by Ciba Geigy Inc.); and
  2 parts by weight of 2,4-diethylthioxanthone (Kayacure DETEX, produced by Nippon Kayaku Co., Ltd.)

Thermosetting component:
  80 parts by weight of bisphenol A type epoxy resin produced by Yuka Shell Epoxy Co., Ltd. (trade name: Epicoat 1001)

Solvent:
  20 parts by weight of butyl cellosolve acetate

Fire retardant:
  40 parts by weight of bromated epoxy methacrylate

Auxiliary fire retardant:
  6 parts by weight of phosphoric acid ester

The resist composition thus prepared was applied to a 0.4 mm-thick glass epoxy laminate-based printed circuit board by screen printing method to a thickness of from 20 to 30 μm, and then dried at a temperature of 75° C. for 30 minutes. The coating film thus prepared was then exposed to light from a photosolder double-sided exposure equipment through a photomask at a dose of 500 mJ/cm$^2$.

Various evaluations

Subsequently, the printed circuit board samples thus prepared were each subjected to pencil hardness test and crosscut test according to JIS-D202. Further, the samples were floated on a molten solder bath having a temperature of 260° C. to observe if the solder resist was separated or peeled off from the printed circuit board. As a result, both Example 4 and Comparative Example 3 showed nothing peculiar.

The printed circuit board samples were then measured for surface insulating resistance according to J pattern in test pattern for multi-layer printed circuit board defined in JIS-C5012. As a result, all the samples showed an initial surface insulating resistance of from $10^{12}$ to $10^{13}$ Ω and a surface insulating resistance of from $10^{11}$ to $10^{12}$ Ω after moistening (C-96/850/85, BIAS50VDC).

Figure 1:
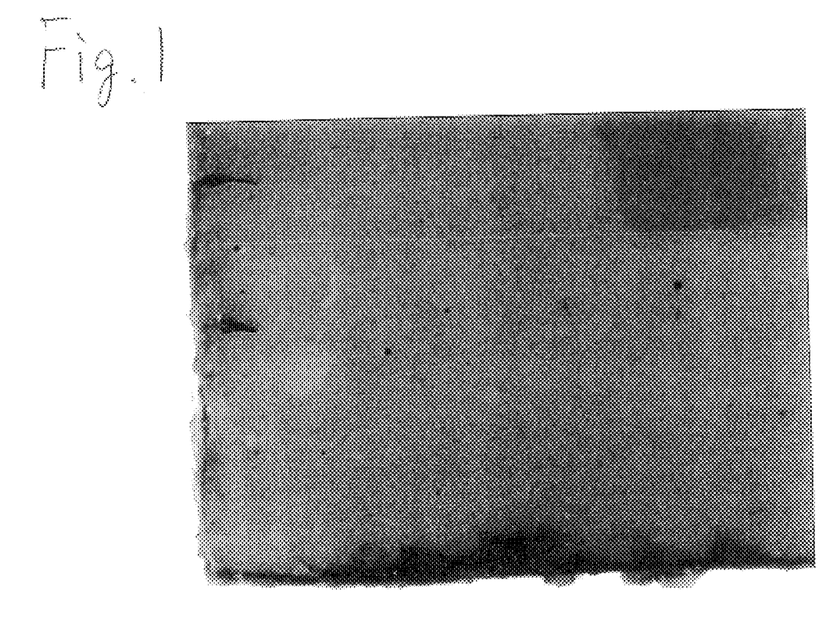
FIG. 1 is a microphotograph of a corner portion of the substrate used in Example 4, which had been subjected to a punching test.
Figure 2:
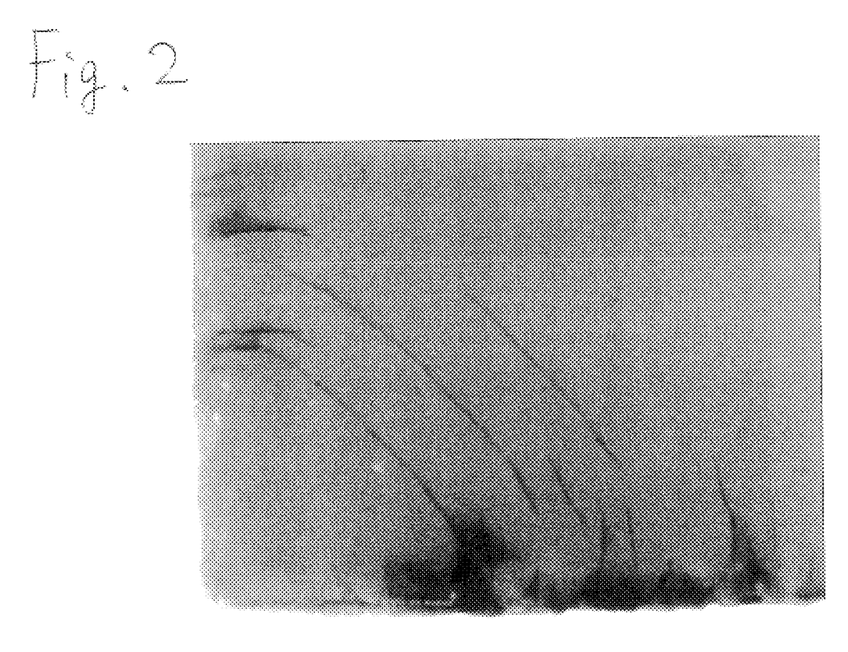
FIG. 2 is a microphotograph of a corner portion of the substrate used in Comparative Example 3, which had been subjected to a punching test.

The samples were each placed in a minidisc press produced by Kamekura Seiki K.K. in such an arrangement that the male half of the press comes in contact with the cured resist of the invention. The sample was then punched by a 2-cm square-punching die. The substrate (2-cm square) thus dropped was then observed for cracking under a microscope. A microphotograph of a corner portion of the test piece thus punched is shown in FIG. 1 (Example 4) and FIG. 2 (Comparative Example 3). In FIG. 1, there shows no cracking on the resist portion. On the other hand, in FIG. 2, several arch stripes (crack) centered at the corner were observed at the resist portion. In these figures, the black portion around the substrate indicates a lost portion developed during punching.

The resist composition according to the present invention exhibits an excellent adhesion to copper foil circuit, a high flexibility that prevents cracking, a high impact resistance, a high heat resistance, a high fire retardance and a high reliability in insulation. The resist composition according to the present invention is remarkably excellent in adhesion to copper and heat resistance and thus is useful as solder resist. As mentioned above, the present invention can provide a resist for printed circuit board excellent in reliability and mass-producibilty and thus has a great industrial value in application.

While the invention has been described in detail and with reference to specific examples thereof, it will be apparent to one skilled in the art that various changes and modifications can be made therein without departing from the spirit and scope thereof.

What is claimed is:

1. A solder resist composition comprising:
    a curable composition mainly comprising (1) at least one of an alkali-soluble acrylic compound and an alkali-soluble methacrylic compound;
    (2) a fine-particulate crosslinked elastic polymer having a carboxyl group; and an average particle diameter less than 0.1 μm, said fine-particulate crosslinked elastic polymer being present in an amount from 5 to 40% by weight based on the total weight of the resist composition; and
    (3) an agent for enhancing adhesion with respect to copper comprising at least one of a carboxyl benzotriazole and a phosphoric acid acrylate.
2. The solder resist composition according to claim 1, wherein said curable composition is an ultraviolet curable composition (A) which comprises:
    (A1) at least one of an alkali-soluble acrylic compound and an alkali-soluble methacrylic compound, each having a carboxyl group;
    (A2) a polymerizable compound having one or more C=C unsaturated double bonds;
    (A3) an ultraviolet-ray polymerization initiator for said polymerizable compound (A2); and
    (A4) a thermal polymerization initiator for said polymerizable compound (A2).
3. The resist composition according to claim 2, further comprising a sensitizer for ultraviolet-ray polymerization.
4. The resist composition according to claim 1, wherein said at least one alkali-soluble (meth)acrylic compound (1) has a carboxyl group.
5. The resist composition according to claim 4, wherein said at least one alkali-soluble (meth)acrylic compound (1) is a reaction product of:
    a reaction product of an epoxy compound and an unsaturated monocarboxylic acid; and
    a polybasic acid anhydride.
6. The resist composition according to claim 5, wherein said at least one alkali-soluble (meth)acrylic compound (1) is a carboxyl group-containing compound obtained by the reaction of at least one epoxy (meth)acrylate with a polybasic acid anhydride.
7. A solder resist formed from a resist composition according to claim 1.
8. A solder resist film obtained by forming a resist composition according to claim 1 into sheet.
9. A printed circuit board having thereon a solder resist formed from a resist composition according to claim 1.

* * * * *